United States Patent [19]

Kuwano et al.

[11] Patent Number: 4,626,878

[45] Date of Patent: Dec. 2, 1986

[54] SEMICONDUCTOR OPTICAL LOGICAL DEVICE

[75] Inventors: Yukinori Kuwano; Shoichi Nakano, both of Osaka; Masaru Takeuchi, Kyoto, all of Japan

[73] Assignee: Sanyo Electric Co., Ltd., Japan

[21] Appl. No.: 447,195

[22] Filed: Dec. 6, 1982

[30] Foreign Application Priority Data

Dec. 18, 1981 [JP]  Japan .................................. 56-205953
Dec. 11, 1981 [JP]  Japan .................................. 56-200469
Dec. 17, 1981 [JP]  Japan .................................. 56-204596

[51] Int. Cl.$^4$ ...................... H01L 31/12; A01L 31/16
[52] U.S. Cl. .......................................... 357/19; 357/2; 357/17; 357/30
[58] Field of Search .................. 357/19, 17, 2, 30; 372/8; 250/211 J

[56] References Cited

U.S. PATENT DOCUMENTS

| | | | |
|---|---|---|---|
| 3,748,480 | 7/1973 | Coleman | 250/211 J |
| 3,818,451 | 6/1974 | Coleman | 357/17 |
| 4,001,859 | 1/1977 | Miyoshi et al. | 357/19 |
| 4,069,492 | 1/1978 | Pankove et al. | 357/17 |
| 4,281,208 | 7/1981 | Kuwano et al. | 357/30 |

FOREIGN PATENT DOCUMENTS

| | | | |
|---|---|---|---|
| 0078794 | 7/1978 | Japan | 357/19 |
| 0051880 | 5/1981 | Japan | 357/2 |

*Primary Examiner*—James W. Davie
*Assistant Examiner*—Georgia Y. Epps
*Attorney, Agent, or Firm*—Darby & Darby

[57] ABSTRACT

A semiconductor optical logical device comprises two light-emitting elements (2a, 2b) formed on one main surface of a transparent substrate (1), and two light sensitive elements (3a, 3b) formed on the other main surface faced to the light emitting elements (2a, 2b), respectively. The two light sensitive elements (3a, 3b) are comprised of amorphous semiconductor and are electrically connected in series. On the other hand, the light-emitting elements (2a, 2b) are driven responsive to individual input signals, respectively. If and when two input signals are applied simultaneously, the two light-emitting elements (2a, 2b) emit light simultaneously, so that an output is obtained from the two light sensitive elements connected in series. If and when only one input signal is applied, no output is obtained. Thus, an optical logical product circuit is provided.

12 Claims, 12 Drawing Figures

SEMICONDUCTOR OPTICAL LOGICAL DEVICE

BACKGROUND OF THE INVENTION

1. Field of the Invention

The present invention generally relates to a semiconductor optical logical device. More specifically, the present invention relates to a novel semiconductor optical logical device including a light sensitive element composed of non-single crystalline semiconductor such as amorphous semiconductor (including that which is partially micro-crystallized), polycrystalline semiconductor, or the like.

2. Description of the Prior Art

As various semiconductor materials have been recently developed, it was observed that a valence control considered difficult in the past becomes possible in amorphous silicon obtained through a plasma reaction or the like of silane and thus attention has been paid to this type of amorphous semiconductor.

SUMMARY OF THE INVENTION

A principal object of the present invention is to provide a novel semiconductor optical logical device including a light sensitive element comprised of non-single crystalline semiconductor such as amorphous semiconductor, polycrystalline semiconductor, or the like.

A semiconductor optical logical device in accordance with the present invention comprises a plurality of light-emitting elements each being independently responsive to an input signal for emitting light, and one or more light sensitive elements comprised of non-single crystalline semiconductor for commonly receiving or for individually receiving the light from the respective light-emitting elements for converting the light into an electrical signal, wherein a logical output of the input signals applied to the plurality of light-emitting elements is obtained in response to the outputs from one or more light sensitive elements.

According to the present invention, since the input signal is once converted into a light signal, a device of a response rate can be achieved which is comparable to that in case where single crystalline semiconductor is utilized, in spite of the fact that non-single crystalline semiconductor is utilized. Furthermore, by employing amorphous semiconductors, devices can be manufactured with little manufacturing energy and with simplified steps on a continual mass production basis as compared with a case of single crystalline semiconductor. In addition, since a very thin layer can be formed using plasma reaction (glow discharge), sputtering, or the like, an approximate flat substrate surface can be readily provided in forming an amorphous semiconductor layer. Since amorphous semiconductor can be grown anywhere in any condition of the substrate after once such an approximate flat substrate surface is attained, it becomes possible to make photocoupling pairs in a multilayer fashion or in a three-dimensional manner, whereby the degree of integration can be enhanced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
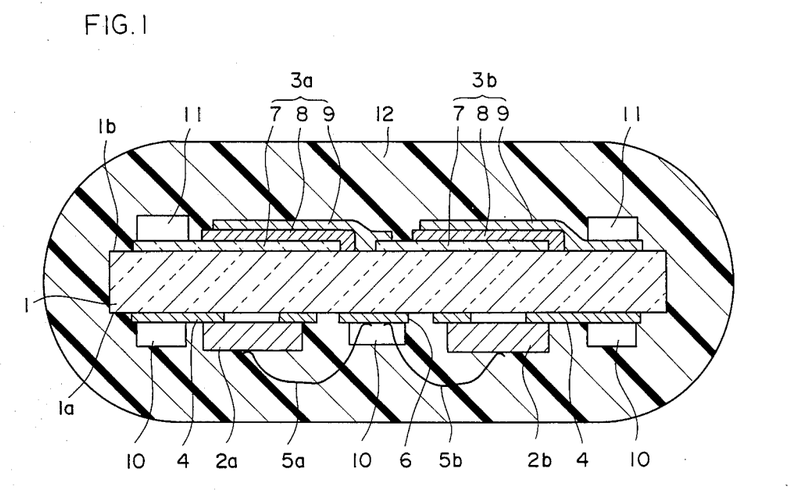
FIG. 1 is a sectional view showing one embodiment of the present invention.

FIG. 1 shows one embodiment of the present invention. Referring to the figure, the reference numeral 1 denotes a transparent insulating substrate of glass, heat resistive plastic or the like, the reference characters 2a and 2b denote first and second light-emitting elements disposed on one main surface 1a of one of the insulating substrate 1, and the reference characters 3a and 3b denote first and second light sensitive elements formed on the other main surface 1b of the insulating substrate 1, the first and second light-emitting elements 2a and 2b and the first and second light sensitive elements 3a and 3b, respectively, being faced to each other with the insulating substrate 1 therebetween.

Figure 2:
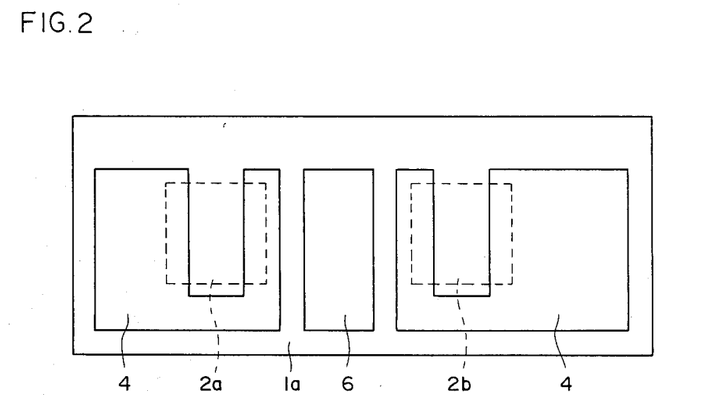
FIG. 2 is a diagrammatic view showing an arrangement of the elements of the FIG. 1 embodiment.

The above described first and second light-emitting elements 2a and 2b are made of a single crystal of gallium phosphate (GaP), for example, and a portion of the electrode surface is deposited on one main surface 1a of the insulating substrate 1 as shown in FIG. 2 through a conductive adhesive agent 4 of such as a silver paste as pattern screen processed so as not to interrupt light transmitting through the insulating substrate 1. The other electrode surface of the above described first and second light-emitting elements 2a and 2b is coupled to an electrode film 6 formed on the insulating substrate 1 through wire leads 5a and 5b.

On the other hand, the first and second light sensitive elements 3a and 3b formed on the other main surface 1b of the insulating substrate 1 are structured to be layered such that an amorphous semiconductor layer 8 of a PIN junction type, for example, is deposited on a transparent electrode film 7, as patterned, of tin oxide ($SnO_2$), indium oxide ($In_2O_3$), indium-tin oxide ($In_2O_3:SnO_2$) or the like on the insulating substrate 1 and then a metallic electrode film 9 of aluminum or the like is layered thereon. The metallic electrode film 9 of the first light sensitive element 3a is coupled to the transparent electrode film 7 of the second light sensitive element 3b extending on and contiguous to the insulating substrate 1. As a result, the first light sensitive element 3a and the second light sensitive element 3b are placed in a series connection.

Now a more specific embodiment will be described in conjunction with a manufacturing process thereof.

First the transparent electrode film 7 is deposited by evaporation or sputtering and patterned on the insulating substrate 1 made of glass and then the insulating substrate 1 is disposed between reaction electrodes of a plasma reaction furnace. Then with the insulating substrate 1 heated at approximately 300° C. in the reaction furnace, a silane ($SiH_4$) gas and an impurity gas of diborane ($B_2H_6$) at the concentration of 1000 ppm are introduced in the reaction furnace. Then a high frequency electric power of 13.56 MHz and 100 W is applied to the above described reaction electrodes, whereby amorphous silicon (a-Si:H) of P-type is obtained on the insulating substrate 1 with the thickness of approximately 100 Å. Thereafter only $B_2H_6$ gas is removed and I-type a-Si:H is deposited at the thickness of approximately 5000 Å. Then phosphine ($PH_3$) serving as an impurity gas is mixed thereinto at the concentration of 1000 ppm, so that N-type a-Si:H is formed with the thickness of approximately 300 Å, whereby an amorphous silicon (a-Si:H) semiconductor layer having a PIN junction with the respective PIN layers laminated from the insulating substrate 1 is provided. Meanwhile, since the growth rate of the above described a-Si:H is approximately 1 $\mu$m/hr for each of the layers, the time is controlled to obtain a desired thickness for each.

Then the above described amorphous silicon semiconductor layer 8 is photoetched to define a predetermined pattern or is subjected to a plasma pattern etching or the like to form a pattern. Alternatively, the amorphous silicon semiconductor layer 8 may be selectively formed using a metallic mask without using the above described method. Finally, a metallic electrode film 9 of aluminum is evaporated on the above described amorphous silicon semiconductor layer 8 and a patterning process is performed through etching so that the first light sensitive element 3a and the second light sensitive element 3b may be placed in a series connection.

The first and second light sensitive elements 3a and 3b made of the PIN junction type amorphous silicon semiconductor layer 8 have the light sensitive central wavelength $\lambda_1$ at approximately 580 nm.

One example of such light sensitive element may be structured in accordance with the teaching in U.S. Pat. No. 4,281,208 issued July 28, 1981.

On the other hand, the first and second light-emitting elements 2a and 2b are implemented using light-emitting diode pellets of green color made of a GaP single crystal of $\lambda_2 \approx 565$ nm so that the central wavelength $\lambda_1$ of the first and second light sensitive elements 3a and 3b may be consistent with the central wavelength $\lambda_2$ of light emission. Then face down bonding is made to one electrode surface of the above described LED pellets, as shown by the dotted line, through a conductive adhesive agent 4 as pattern screen processed as shown in FIG. 2, on one main surface 1a to which the light sensitive elements 2a and 2b of the insulating substrate 1 are faced. Then the other electrode surface is bonded to the electrode film 6 formed on the insulating substrate 1 using the wire leads 5a and 5b. These first and second light-emitting elements 2a and 2b are connected to the above described conductive adhesive agent 4 and the electrode film 6 so as to be independently responsive to a supply of an input signal to emit light.

Then finally lead frames 10 and 11 serving as input lines of the first and second light-emitting elements 2a and 2b and output lines of the first and second light sensitive elements 3a and 3b are coupled, whereupon the composite is molded with a molding material 12 for interrupting incident light as shown in FIG. 1, thereby to complete a semiconductor optical logical device.

Figure 3:
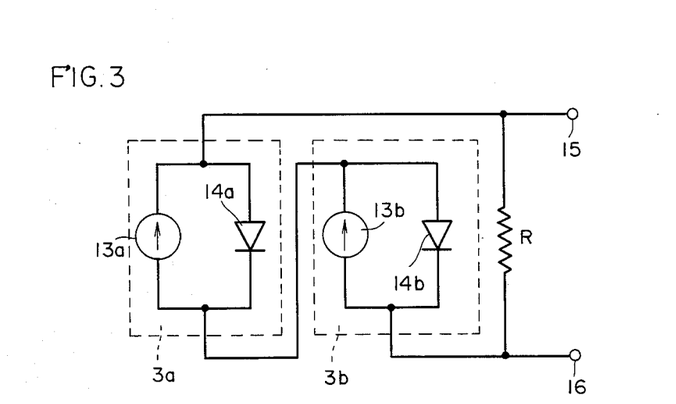
FIG. 3 is an equivalent circuit diagram of the FIG. 1 embodiment.

The light sensitive end of the thus manufactured semiconductor optical logical device comprises the first and second light sensitive elements 3a and 3b placed in a series connection and the same can be shown in an equivalent circuit diagram as shown in FIG. 3. More specifically, the light sensitive elements 3a and 3b can be represented as an inverted parallel connection of direct current sources 13a and 13b and diodes 14a and 14b, respectively. In FIG. 3 the reference character R denotes a load resistance connected between the output terminals 15 and 16.

When an input signal is supplied through the lead frames 10 and 10 to the first light-emitting element 2a, the first light-emitting element 2a operates to emit light, which transmits through the insulating substrate 1 and is emitted to impinge upon the opposing first light sensitive element 3a. The first light sensitive element 3a as illuminated produces electrons and holes in the free state mainly at the I-type layer of the amorphous silicon semiconductor layer 8 and the electrons and the holes move so as to be attracted by the PIN junction electric field, thereby to produce a photovoltaic force between the transparent electrode film 7 and the metallic electrode film 9. However, since the second light-emitting element 2b is not in a light emission activated state, the opposing second light sensitive element 3b is placed in a state of a diode 14b in a reverse direction to the direct current source 13a caused by the above described photoelectromotive force. Accordingly, no photoelectric current flows through the load resistor R and no output is obtained between the output terminals 15 and 16.

On the other hand, if and when an input signal is applied to the second light-emitting element 2b to emit light in such a state, the second light sensitive element 3b turns from the state of the reverse directional diode 14b to a forward directional direct current source 13b, whereby a photocurrent flows through the load resistor R. As a result, an output signal is obtained between the output terminals 15 and 16. By thus connecting the two light sensitive elements 3a and 3b in series and opposing the two light-emitting elements 2a and 2b operating for light emission independently for each input signal, a logical product of the input signals can be obtained as an output signal.

Figure 4:
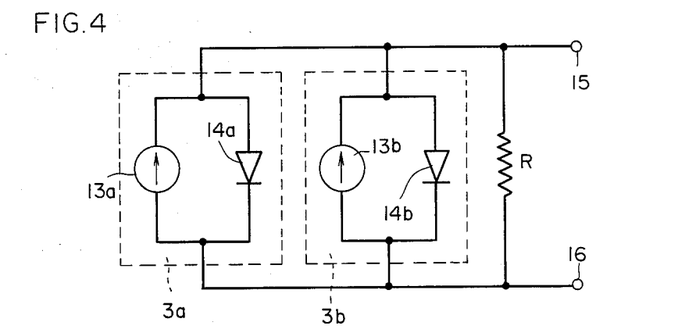
FIG. 4 is another example of such equivalent circuit diagram.

Likewise, by connecting the first light sensitive element 3a and the second light sensitive element 3b in a parallel relation as shown in FIG. 4, a logical sum can be obtained between the output terminals 15 and 16 if and when at least either the first or second light-emitting element 2a or 2b emits light.

Figure 5:
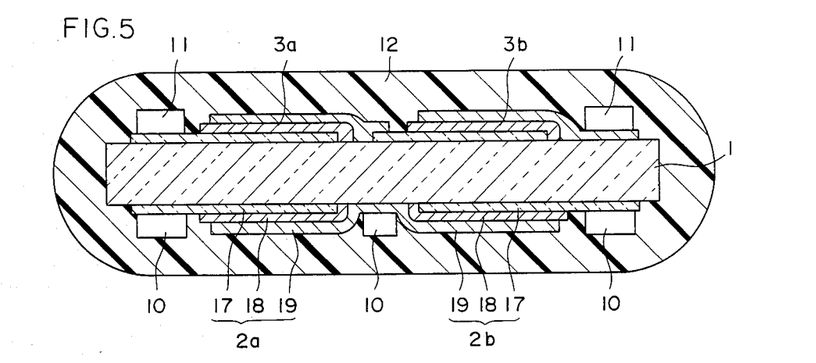
FIG. 5 is a sectional view of another embodiment of the present invention.

FIG. 5 shows another embodiment of the present invention and the feature thereof resides in formation of the first and second light-emitting elements 2a and 2b with amorphous semiconductor. In manufacture, formation is made using plasma reaction in the same manner as the light sensitive elements 3a and 3b. More specifically, after the transparent electrode film 17 is formed in a predetermined pattern on one main surface of the insulating substrate 1, a reaction gas including 70% of silane SiH$_4$ and 30% of methane CH$_4$ is introduced, thereby to provide an amorphous silicon carbide (a-SiC:H) semiconductor layer 18 of the PIN junction type. B$_2$H$_6$ and PH$_3$ are used each at the concentrations of 1000 ppm as an impurity gas for controlling the P-type and the N-type, respectively. The respective film thicknesses of the thus obtained PIN layers are in succession 100 to 200 Å, 5000 Å, and 500 Å, respectively, wherein the central wavelength $\lambda_3$ of light emission was 680 nm.

Meanwhile, one example of such amorphous semiconductor light-emitting element may be implemented in accordance with the teaching in U.S. Pat. No. 4,069,492 issued Jan. 17, 1978.

On the other hand, although the first and second light sensitive elements 3a and 3b of the previous embodiment comprise amorphous silicon semiconductor layer 8, the same are inconvenient to the present embodiment because the central wavelength $\lambda_1$ is 580 nm. Therefore, in the embodiment in description the first and second light sensitive elements 3a and 3b are implemented using an amorphous silicon germanium (a-SiGe:H) semiconductor layer 8 having the central wavelength $\lambda_4$ being 680 nm which is the same as that of the above described light-emitting elements 2a and 2b. The reaction gas introduced at that time is 60% of silane (SiH$_4$) and 40% of germane (GeH$_4$).

According to such structure, the inventive device can be manufactured at an inexpensive cost by using amorphous semiconductor for the light-emitting elements 2a and 2b and the metallic electrode film 19 can be formed to extend on the insulating substrate 1 without the wire leads 5a and 5b, with the result that disconnection of the wire leads 5a and 5b in filling a molding material 20 can be avoided. By using a micro-crystallization of amorphous semiconductor for the light-emitting elements and the light sensitive elements, a high efficiency can be attained without decreasing an optical forbidden band width. Such micro-crystallization of amorphous semiconductor can be readily attained by increasing a high frequency power on the occasion of the above described plasma reaction to be as large as ten times and by increasing the concentration of hydrogen.

As described previously, the amorphous semiconductor layers 8 and 18 exhibit a characteristic in which the light emission central wavelength have been shifted toward a wavelength longer than the light sensitive central wavelength in comparison of a case where a light-emitting element is formed with the same material and a case where the light sensitive element is formed with the same material, and any element having the sensitivity not only in a visible region but also in an ultraviolet or in an infrared region can be readily formed by properly selecting the composition and the composition ratio of the reaction gas.

Figure 6:
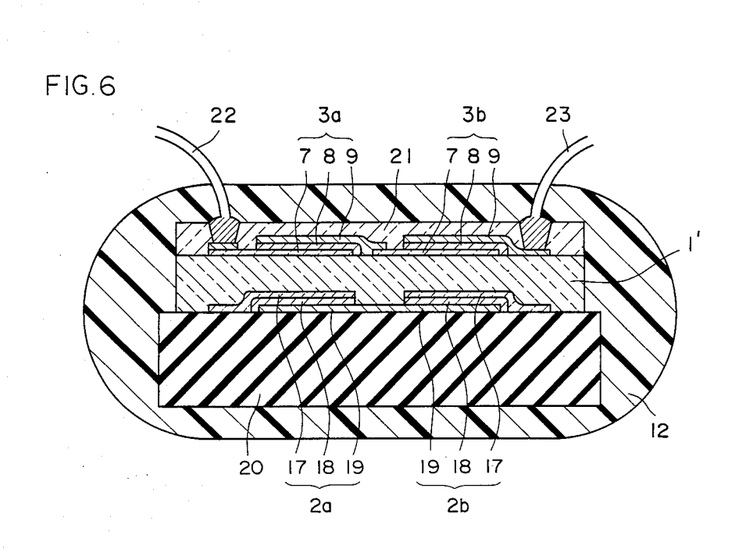
FIG. 6 is a sectional view of a further embodiment of the present invention.

FIG. 6 shows another embodiment of the present invention, in which the reference character 20 denotes an insulating substrate of glass, heat resistive plastic, ceramic or the like, and the reference characters 2a and 2b denote first and second light-emitting elements disposed on one main surface of the insulating substrate 20, wherein the light-emitting elements 2a and 2b have a sandwich structure in which the amorphous semiconductor layer 18 is sandwiched between a metallic electrode film 17 of stainless steel or the like and an insulating electrode film 19 at both the front and rear surfaces of the amorphous semiconductor layer 18. The reference character 1' denotes a transparent insulating film of silicon dioxide (SiO$_2$), silicon nitride (Si$_3$N$_4$) or the like covering the light-emitting surface of the first and second light-emitting elements 2a and 2b, and the reference characters 3a and 3b denote first and second light sensitive elements facing to the first and second light-emitting elements 2a and 2b formed on the above described transparent insulating film 1', wherein the light sensitive elements 3a and 3b have a sandwich structure in which the transparent electrode film 7, the amorphous semiconductor layer 8 and the metallic electrode film 9 are in succession layered from the light receiving surface. The metallic electrode film 9 of the first light sensitive element 3 is coupled to the transparent electrode film 7 of the second light sensitive element 3 extending on and contiguous to the transparent insulating film 1'. As a result, the first light sensitive element 3a and the second light sensitive element 3b are connected to be in a series connection. The reference character 21 denotes a protection film of SiO$_2$, SiO$_3$N$_4$ or the like covering the surface of the above described light sensitive elements 3a and 3b, and the reference characters 22 and 23 denote lead wires for withdrawing a series connection output of the light sensitive elements 3a and 3b through a contact hole formed on the above described protection film 21.

Now a specific embodiment will be described in conjunction with a manufacturing process thereof.

First a metallic electrode film 19 of stainless steel is deposited by sputtering on the insulating substrate 20 made of aluminum ceramic and the same is patterned in a desired shape by etching. The insulating substrate 20 having the metallic electrode film 19 as patterned is disposed between the reaction electrodes of the plasma reaction furnace and a reaction gas and an impurity gas are suitably introduced with the above described insulating substrate 20 heated at approximately 300° C. In forming the amorphous silicon carbide layer 18 of a PIN junction type, for example, silane (SiH$_4$) and methane (CH$_4$) are used as a reaction gas and diborane (B$_2$H$_6$) is used as an impurity gas for determining the P-type, and phosphine (PH$_3$) is used as an impurity gas for determining the N-type. The mixture ratio of these gases are selected such that SiH$_4$ is 70%, CH$_4$ is 30%, and B$_2$H$_6$ and PH$_3$ are each 1000 ppm. A high frequency electric power of 13.56 MHz and 100 W is applied between the reaction electrodes. As a result, the P-type layer of approximately 100 Å, the I-type layer of approximately 5000 Å, and the N-type layer of approximately 300 Å in thickness are grown. The growth rate of the above described amorphous silicon carbide layer 18 is approximately 1 µm/hr for each layer and therefore the time is controlled to obtain a desired thickness as described above for each.

Then the amorphous silicon carbide layer 18 is formed in a predetermined pattern by photoeching, plasma eching or the like. Alternatively, the amorphous silicon carbide layer 18 may be selectively formed using a metallic mask and by not using the above described means. Finally a transparent electrode film 17 of indium oxide (In$_2$O$_3$), tin oxide (SnO$_2$), indium·tin oxide (In$_2$O$_3$:SnO$_2$) or the like is deposited by evaporation on the amorphous silicon carbide layer 18. Then the transparent electrode film 17 is patterned, thereby to complete the first and second light-emitting elements 2a and 2b. The first and second light-emitting elements 2a and 2b made of such PIN junction type amorphous silicon carbide layer has the light emission central wavelength $\lambda_1$ at approximately 680 nm.

Then the transparent insulating film 1' of SiO$_2$ is formed to a film thickness of several microns ($\mu$m) by a chemical vapor deposition process on the above described first and second light-emitting elements 2a and 2b and the surface thereof is made even.

By way of the final step the first and second light sensitive elements 3a and 3b are layered on the above described transparent insulating film 1'. First the transparent electrode film 7 is deposited on the surface of the transparent insulating film 1' as a substrate surface and then the same is patterned. Then an amorphous silicon germanium (a-SiGe:H) layer 8 of the PIN junction type is formed through plasma reaction. The reaction gas introduced at that time consists of silane (SiH$_4$) by 60% and germane (GeH$_4$) by 40%. The other conditions may be the same as those for the amorphous silicon carbide layer 18 of the light-emitting elements 2a and 2b. Then the metallic electrode film 9 of aluminum is vapored on the amorphous silicon germanium layer 8 and the same is etched to be patterned so that the first light sensitive element 3a and the second light sensitive element 3b may be connected in a series connection.

The first and second light sensitive elements 3a and 3b thus made of the amorphous silicon germanium layer 8 of the PIN junction type have the light emission central wavelength $\lambda_2$ at 680 nm which is the same as the light emission central wavelength $\lambda_1$ of the first and second light-emitting elements 2a and 2b.

Then the protecting film 21 of SiO$_2$ is deposited and the lead wires 22 and 23 are coupled, whereupon the composite is molded with the molding material 12 for interrupting incident light, thereby to complete a semiconductor photocoupling device.

The light receiving side of the semiconductor photocoupling device or the optical logical device thus manufactured includes a series connection of the first and second light sensitive elements 7a and 7b, which can be shown in an equivalent circuit diagram as shown in FIG. 3.

By likewise connecting the first light sensitive element 3a and the second light sensitive elements 3b in a parallel connection as shown in FIG. 4, a logical sum product can be obtained between the output terminals 15 and 16 if and when at least either the first or the second light-emitting element 2a or 2b emits light.

Meanwhile, the amorphous semiconductor has a characteristic in which the light emission central wavelength $\lambda_1$ has been shifted toward a longer wavelength as compared with the light sensitive central wavelength $\lambda_2$ in comparison of the case where the light-emitting elements 2a and 2b are made of the same material and the case where the light sensitive elements 3a and 3b are made of the same material. Therefore, in the above described embodiment the light-emitting elements 2a and 2b are made of amorphous silicon carbide and the light sensitive elements 3a and 3b are made of amorphous silicon germanium having the light sensitive central wavelength $\lambda_2$ being approximately at 680 nm which is the light emission central wavelength $\lambda_1$ of the above described amorphous silicon carbide. By properly selecting the composition and the composition ratio of the reaction gas, the elements having the sensitivity not only of the above described embodiment but also in the infrared region can be formed as desired.

Figure 7:
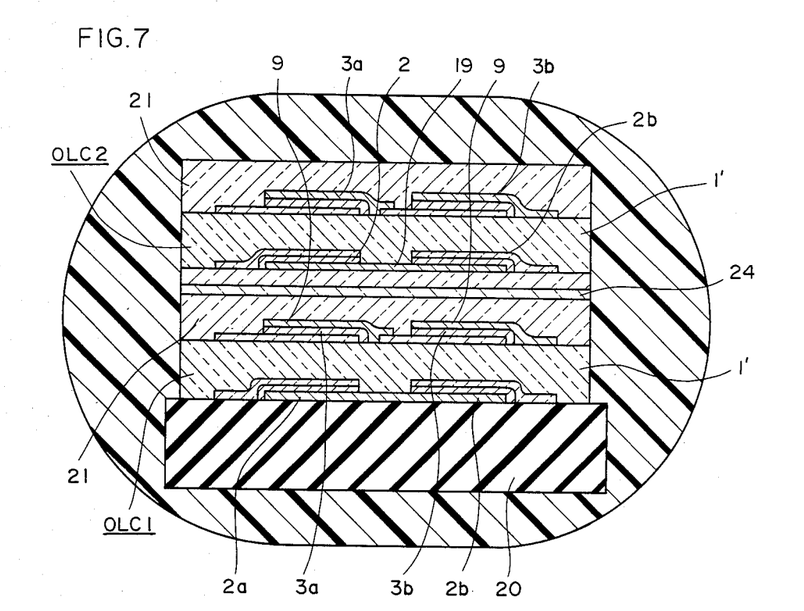
FIG. 7 is a sectional view of a preferred embodiment of the FIG. 6 embodiment.

FIG. 7 is a further embodiment of the present invention, which is an expansion of the FIG. 6 embodiment.

More specifically, assuming that a pair of semiconductor optical logical devices comprising the first and second light-emitting elements 2a and 2b and the first and second light sensitive elements 3a and 3b as shown in FIG. 6 is a first photocoupling pair or an optical logical circuit OLC1, then the FIG. 7 embodiment comprises a multilayer including a second optical logical circuit OLC2 having the first and second light-emitting elements 2a and 2b and the first and second light sensitive elements 3a and 3b laminated on the first optical logical circuit OLC1. A metallic light shielding member 24 of stainless steel or the like is disposed between the first optical logical circuit OLC1 and the second optical logical circuit OLC2 with the same insulated, so that light transmission therebetween may be interrupted. The above described metallic light shielding member 24 may not be necessarily provided, inasmuch as the light sensitive elements 3a and 3b of the first optical logical circuit OLC1 and the light-emitting elements 2a and 2b of the second optical logical circuit OLC2 are faced to each other through the respective metallic electrode films 9 and 19 and the metallic electrode films 9 and 19 serve as a light shielding member.

It is also possible to make difference in the sensitivity wavelength of each of the optical logical circuits OLC1 and OLC2 by differentiating the materials or the compositions of the light-emitting elements 2a and 2b, and 2a and 2b and the light sensitive elements 3a and 3b, and 3a and 3b of the first optical logical circuit OLC1 and the second optical logical circuit OLC2, respectively, and in such a case again the metallic light shielding member 24 can be dispensed with.

The light-emitting elements 2a and 2b, and 2a and 2b and the light sensitive elements 3a and 3b, and 3a and 3b thus made of amorphous semiconductor does not require any specific technology such as a graphoepitaxial technology, a laser anneal technology or the like, as is different from the case of single crystalline semiconductor, and hence can be implemented in a multilayer structure with extreme ease.

Meanwhile, although the above described optical logical circuit was structured to comprise one set of two light-emitting elements and one set of two light sensitive elements, the same may be structured to comprise one set of one light-emitting element and one set of one light sensitive element, or to comprise one set of three or more elements for the light-emitting elements and the light sensitive elements. A multilayer structure is not limited to a two-layer structure but also may be a three-layer structure, a four-layer structure or the like.

When the thickness of the elements OLC1 and OLC2 per se is selected to be several $\mu$m and the thickness of the transparent insulating film 1' is selected to be 5 to 6 $\mu$m in a structure having the optical logical circuit laminated as in the case of the above described embodiment, a device of a very small thickness and of flatness as a whole can be provided. If the transparent insulating film 1' between the light-emitting elements and the light sensitive elements is thus thin, there is no mutual interference of light in the adjacent photocoupling and accordingly malfunction due to the so-called cross talk can be avoided.

Figure 8:
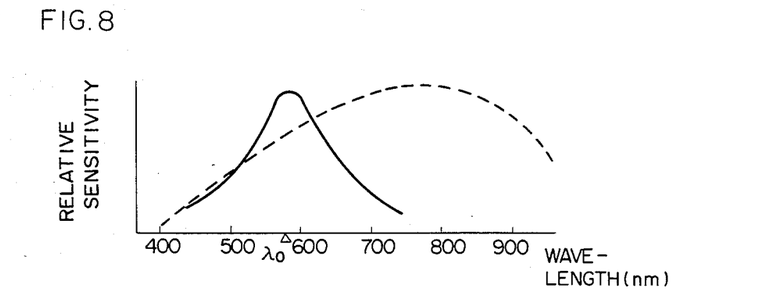
FIG. 8 is a graph showing a spectral response of a light sensitive element.

FIG. 8 is a graph showing a spectral response of PIN junction type amorphous silicon and single crystalline silicon. More specifically, the spectrum light sensitivity of amorphous silicon exhibits a single peak characteristic having the light sensitive peak wavelength $\lambda_0$ at approximately 580 nm as shown by the solid line. On the other hand, the single crystalline silicon exhibits an easy slope mountain shaped characteristic having a wide range of 400 to 1000 nm in wavelength as shown by the dotted line.

The embodiment to be described subsequently was implemented in consideration of such spectral response of amorphous semiconductor and the embodiment will be described in detail with reference to FIGS. 9 to 12.

Figure 9:
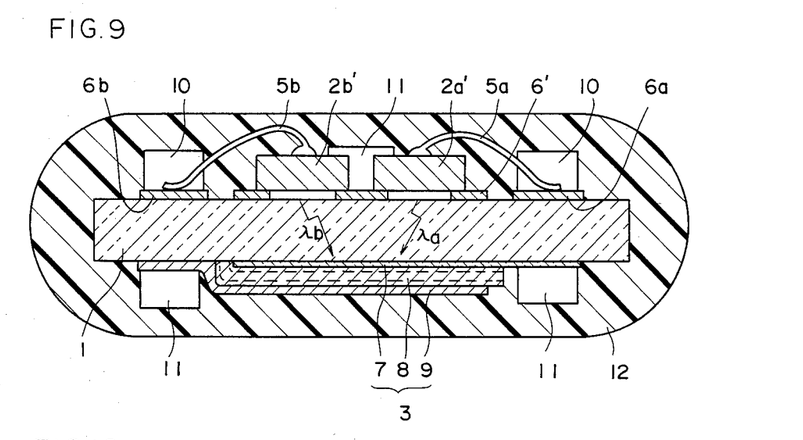
FIG. 9 is a sectional view showing still a further embodiment of the present invention.
Figure 10:
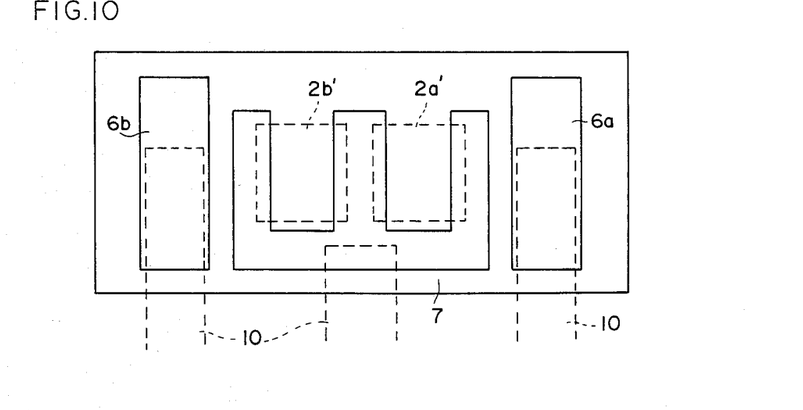
FIG. 10 is a diagrammatic view showing an arrangement of the elements of the FIG. 9 embodiment.
Figure 11:
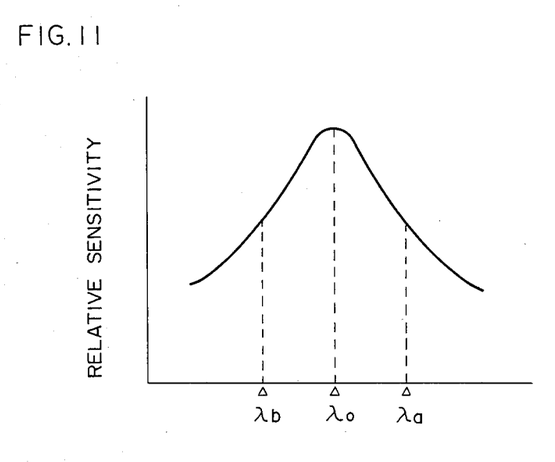
FIG. 11 is a graph showing a relation between the intensity and the wavelength of the light of the light-emitting element of the FIG. 9 embodiment.

FIG. 9 is a sectional view of the embodiment, wherein the reference character 1 denotes a transparent insulating substrate of glass, heat resistive plastic or the like, the reference character 3 denotes a light sensitive element having a spectral response as shown in FIG. 11 in which the light sensitive peak comes to the wavelength $\lambda_0$. The light sensitive element 3 has a layered structure in which the transparent electrode film 7, the amorphous semiconductor layer 8 and the metallic electrode film 9 are in succession laminated on one main surface of the insulating substrate 1. The reference characters $2a'$ and $2b'$ denote the first and second light sources faced to the above described light sensitive element 3 formed on the other main surface of the above described insulating substrate 1 and made of light-emitting diode pellets, for example, wherein the respective light sources $2a'$ and $2b'$ emit light of the first wavelength region which is of a wavelength longer than the peak wavelength $\lambda_0$ and light of the second wavelength region which is of a wavelength shorter than the peak wavelength $\lambda_0$. The reference character 6' denotes a common electrode film for the electrode of one of the first and second light sources $2a'$ and $2b'$, which common electrode film is made of a conductive adhesive agent of silver paste or the like and is pattern screened in an E letter shaped as shown in FIG. 10 on the insulating substrate 1 and also serves as fixing means for fixing the first and second light sources $2a'$ and $2b'$. The reference characters $5a$ and $5b$ denote wire leads for connecting the electrode of the other of the first and second light sources $2a'$ and $2b'$ and the electrode pads $6a$ and $6b$ on the insulating substrate 1, the reference characters 10, 11, . . . denote lead frames for supplying an input signal in the above described first and second light sources $2a'$ and $2b'$ and for withdrawing an output signal in the light sensitive element 3, wherein the respective lead frames 10, 11, . . . are electrically and mechanically fixed through a conductive adhesive agent or the like to the respective electrode films 6', $6a$, $6b$, 7 and 9. The reference character 12 denotes a molding material for molding the first and second light sources $2a'$ and $2b'$ for interrupting incident light.

Now a specific embodiment employing PIN junction type amorphous silicon for the amorphous silicon layer 8 of the light sensitive element 3 will be described. Such amorphous silicon is formed by introducing silane ($SiH_4$) as a reaction gas into a plasma reaction furnace and by supplying a high frequency electric power between the reaction electrodes. For example, in forming a P-type layer, dibolane ($B_2H_6$) is properly doped and in forming an N-type layer phosphine ($PH_3$) is properly doped. Then the growth rate is controlled to provide a PIN junction having the respective film thicknesses of approximately 100 Å for the P-type layer, approximately 5000 Å for the I-type (non-doped) layer and approximately 300 Å for the N-type layer. The light sensitive peak wavelength $\lambda_0$ of the above described PIN junction type amorphous silicon is approximately 580 nm.

On the other hand, the light emission wavelengths $\lambda_a$ and $\lambda_b$ of the first and second light sources $2a'$ and $2b'$ are set with reference to approximately 580 nm which is the peak wavelength $\lambda_0$ of the above described light sensitive element 3. The first light source $2a'$ employs a red color light-emitting diode pellet of the light emission wavelength $\lambda_a$ of 700 nmm made of gallium phosphate (GaP) and the second light source 2 may employ a blue color light-emitting diode pellet of the light emission wavelength $\lambda_b$ of 460 nm made of silicon carbide (SiC).

Figure 12:
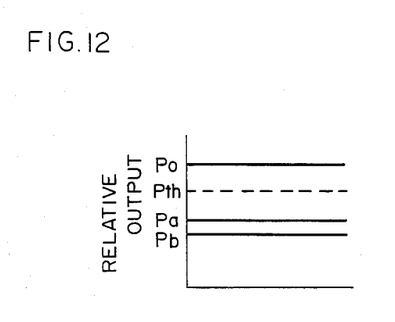
FIG. 12 is a graph showing the output from the light sensitive element of the FIG. 9 embodiment.

If and when an input signal is supplied to the first light source $2a'$ of the light emission wavelength $\lambda_a$ of 700 nm, the first light source $2a'$ operates to emit light, which transmit through the transparent insulating substrate 1 and the transparent electrode film 7 to impinge upon the light sensitive element 3 facing thereto. However, the light emission wavelength $80_a$ of the first light source $2a'$ for emitting light is 700 nm as described above and the peak wavelength $\lambda_0$ of the light sensitive element 3 upon which light impinges is 580 nm and therefore the light of 700 nm is absorbed by the N-type layer of the amorphous silicon layer 8, with the result that an output Pa of a low level smaller than a predetermined level Pth can only be obtained as shown in FIG. 12.

On the other hand, when an input signal is supplied to the second light source $2a'$ of the light emission wavelength $\lambda_b$ of 460 nm, the same likewise operates to emit light to impinge upon the light sensitive element 3. The light of 460 nm reaches the amorphous silicon layer 8 of the light sensitive element 3 to be absorbed by the P-type layer. Accordingly, the output Pb obtained by light emission only of the second light source $2b$ becomes a low level lower than the predetermined level Pth.

Thus, only the output Pa of the low level could be obtained by the light emission of only the first light source $2a'$ and only the output Pb of the low level could be obtained by the light emission of only the second light source $2b'$; however, by causing light emission simultaneously from both of the light sources $2a'$ and $2b'$, the output Pb of a high level higher than the predetermined level Pth is obtained. More specifically, the output of the light sensitive element 3 becomes larger than the predetermined level Pth, only if and when the first and second light sources $2a'$ and $2b'$ make light-emitting operations simultaneously. Accordingly, the output obtained from the light sensitive element 3 becomes a logical product of the input signals of the first and second light sources $2a'$ and $2b'$.

Meanwhile, other approaches may be considered in which germane ($GH_4$) is doped into the reaction gas for the purpose of increasing the relative sensitivity of the first wavelength region of the longer wavelength so that the N-type layer may be changed to be of amorphous silicon germanium; silane ($SiH_4$) is doped into methane ($CH_4$) in order to increase the relative sensitivity of the second wavelength region of the shorter wavelength side so that the P-type layer may be changed to be of amorphous silicon carbide. Furthermore, by properly changing the composition and the composition ratio of the reaction gas, the amorphous semiconductor can be formed so that the light sensitive peak wavelength may be determined as desired without being limited to only the above described embodiment. Alternatively, the light sources $2a'$ and $2b'$ may be made of amorphous semiconductor. In such case, the wire leads 5a and 5b can be dispensed with, as is different in the case of the light-emitting diode pellets, and thus a possibility of disconnection on the occasion of molding can be avoided.

Although the example of employing the PIN junction was shown in the foregoing description, alternatively a PN junction, a heteroface junction, or a Schottky junction may be employed. However, the effect of the present invention is achieved even in the case where the amorphous semiconductor layer forming the light sensitive element does not have a junction form for generating a photoelectromotive force in response to light impingement as described above and instead utilizes a photoconductive effect exhibiting an increasing conductivity in response to light impingement. For example, in modifying the FIG. 9 embodiment to utilize a photoconductive effect of the light sensitive element, the light of a shorter wavelength acts on a relatively shallow portion of the substrate and the light of a longer wavelength reaches to a deep portion of the substrate, with the result that the light sensitive elements are rendered conductive only if and when two kinds of the light are caused to impinge upon simultaneously. This means that a logical product circuit is provided.

In case where a relatively thick transparent substrate 1 is employed, as shown in the FIG. 1 embodiment, a so-called cross talk could arise in which the light from the light-emitting element 2a impinges on the light sensitive element 3b or the light from the light-emitting element 2b impinges on the light sensitive element 3a. The reason is that diffused reflection is liable to occur in the case where the substrate 1 is made of glass, for example. In such a case, one countermeasure can be thought in which the wavelengths of the light beams of the pair of the light-emitting element 2a and the light sensitive element 3a and the pair of the light-emitting element 2b and the light sensitive element 3b are differentiated. Such differentiation of the light emission central wavelength of the light-emitting element or the peak wavelength of the spectral response of the light sensitive element could be achieved with simplicity by simply changing the composition of the semiconductor layer, as described previously, by changing the composition of the gas being introduced to the reaction furnace in the case of amorphous semiconductor, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor optical logical device, comprising:

a transparent substrate having first and second main surfaces;

a plurality of light emitting elements each independently responsive to an input signal, for emitting light, said light emitting elements being disposed on said first main surface; and a plurality of light sensitive elements each of non-single crystalline semiconductor for receiving said light from each said light-emitting elements for converting same into an electrical signal, said light sensitive elements being disposed on said second main surface facing said plurality of said light emitting elements;

said plurality of light emitting elements being spaced apart from each other on said first main surface and leaving a boundary between each of said light emitting elements, and each of said light sensitive elements being spaced apart from each other on said second main surface opposite said boundary, an input electrode being provided at said boundary for supplying an input signal to said light emitting elements;

a conductive adhesive layer formed between said transparent substrate and said plurality of light emitting elements onto said transparent substrate and for external electrical connection, said conductive adhesive layer having portions for defining light emitting regions for allowing for light emission through said portions, whereby a mutual interface between adjacent full coupling pairs of said light emission and said light sensitive elements is prevented;

wherein at least two of said plurality of light sensitive elements are electrically coupled for providing a logical output signal from said at least two of said light sensitive elements.

2. A semiconductor optical logical device in accordance with claim 1, wherein
    said non-single crystalline semiconductor comprises amorphous semiconductor.

3. A semiconductor optical logical device in accordance with claim 2, wherein
    said amorphous semiconductor comprises in part a microcrystal.

4. A semiconductor optical logical device in accordance wdth claim 1, wherein
    each of adjacent ones of said light-emitting elements of said plurality of light-emitting elements has a different light emission wavelength, and
    each of adjacent ones of said light sensitive elements of said plurality of light sensitive elements has a different light sensitive wavelength to each other, whereby
    a mutual interference between adjacent photo-coupling pairs is prevented.

5. A semiconductor photocoupling device, comprising:
    a substrate having a substantially planar face,
    a plurality of light-emitting elements formed from a thin, flat film of non-single crystal film layered on said substrate planar face and each independently responsive to an input signal for emitting light, and having a light emitting surface, disposed away from said substrate,
    a flat transparent insulating film covering said light emitting surface of said light-emitting element, and
    a light sensitive element of non-single crystalling semiconductor film laminated in succession on said transparent insulating film for receiving said light from said light-emitting element transmitting through said transparent insulating film and for converting said light into an electrical signal.

6. A semiconductor photocoupling device, comprising:
    a substrate having a substantially planar face,
    a plurality of light-emitting elements formed from a thin, flat film of non-single crystalline film layered on said substrate planar face each indepedently responsive to an input signal for emitting light, a flat transparent insulating film for covering the light-emitting surface of said light-emitting elements, and a plurality of light sensitive elements of non-single crystalline semiconductor film each receiving said light from each said light-emitting element transmitting through said transparent insulating film for converting said light into an electrical signal, at least two of said plurality of light sensitive elements being electrically coupled to provide a logical output signal, and a second photocoupling pair layered on said first photocoupling pair and including:

a plurality of second light-emitting elements formed from a thin, flat film of non-single crystalline semiconductor each independently responsive to an input signal for emitting light, a second flat transparent insulating film for covering the light-emitting surface of said second light-emitting elements; and a plurality of second light sensitive elements of non-single crystalline semiconductor film each receiving said light from each said light emitting element transmitting through said second transparent insulating film for converting said light into an electrical signal, at least two of said plurality of second light sensitive elements being electrically coupled to provide a logical output signal.

7. A semiconductor photocoupling device, comprising:

a substrate having a substantially planar face, a first photocoupling pair layered on said substrate planar face and including a plurality of first light-emitting elements formed from a thin flat film of non-single crystalline semiconductor each independently responsive to an input signal for emitting light, a first flat transparent insulating film for covering the light-emitting surface of said first light-emitting elements, and a plurality of first light sensitive elements of non-single crystalline semiconductor film each receiving said light from each of said light-emitting element transmitting through said first transparent insulating film for converting said light into an electrical signal, at least two of said plurality of first light sensitive elements being electrically coupled to provide a logical output signal, and a second photocoupling pair layered on said first photocoupling pair and including a plurality of second light-emitting elements formed from a thin, flat film of non-single crystalline semiconductor each independently responsive to an input signal for emitting light, a second flat transparent insulating film for covering the light-emitting surface of said second light-emitting elements, and a plurality of second light sensitive elements of non-single crystalline semiconductor film each receiving said light from each said light emitting element transmitting through said second transparent insulating film for converting said light into an electrical signal, at least two of said plurality of second light sensitive elements being electrically coupled to provide a logical output signal.

8. A semiconductor photocoupling device in accordance with any of claims 5, 6 or 7, wherein said non-single crystalline semiconductor comprises amorphous semiconductor.

9. A semiconductor photocoupling device in accordance with claim 8, wherein
said amorphous semiconductor comprises in part a microcrystal.

10. A semiconductor photocoupling device in accordance with any one of claims 5, 6, or 7, wherein
said non-single crystalline semiconductor comprises polycrystalline semiconductor.

11. A semiconductor optical logical device in accordance with claim 6 or 7, wherein
each of adajcent ones of said light-emitting elements out of said plurality of said light-emitting elements has a different light emission wavelength to each other, and
each of the adjacent ones of said light sensitive elements out of said plurality of light sensitive elements has a different light sensitive wavelength to each other, whereby
a mutual interference between adjacent photocoupling pairs is prevented.

12. A semiconductor optical logical device, comprising:

a transparent substrate having a substantially planar first and second faces, a light sensitive element including amorphous semiconductor having a spectrum sensitivity characteristic with a light reception peak at the wavelength $\lambda_0$, a first light-emitting element for emitting light of a first wavelength region included in said spectrum sensitivity region of said light sensitive element and being of a wavelength longer than said peak wavelength $\lambda_0$, and a second light-emitting element for emitting light of a second wavelength region included in said spectrum sensitivity region of said light sensitive element and being of a wavelength shorter than said peak wavelength $\lambda_0$, said first and second light-emitting element being disposed on said first planar surface and said light sensitive element being disposed on said second planar face to face said light-emitting elements, an output signal being larger than a predetermined level being obtained from said light sensitive element when both said light sources operate to emit light simultaneously.

* * * * *